United States Patent [19]

Sechi

[11] 4,409,557

[45] Oct. 11, 1983

[54] BANDPASS FILTER WITH AN ACTIVE ELEMENT

[75] Inventor: Franco N. Sechi, Lawrenceville, N.J.

[73] Assignee: RCA Corporation, New York, N.Y.

[21] Appl. No.: 256,724

[22] Filed: Apr. 23, 1981

[51] Int. Cl.³ .............................................. H03F 3/191
[52] U.S. Cl. ................................. 330/277; 330/61 A; 330/294; 330/305; 330/311
[58] Field of Search ..................... 330/61 R, 61 A, 70, 330/71, 277, 291, 294, 305, 306, 311

[56] References Cited

U.S. PATENT DOCUMENTS

| 3,401,349 | 9/1968 | Mitchell | 330/305 X |
| 3,693,105 | 9/1972 | Kleinberg | 331/115 |
| 3,731,218 | 5/1973 | Saunders et al. | 330/178 |
| 3,737,801 | 6/1973 | Adams et al. | 331/53 |
| 3,965,441 | 6/1976 | Roy et al. | 331/115 |
| 3,986,152 | 10/1976 | Howell | 333/80 T |
| 4,208,641 | 6/1980 | Suzuki | 333/217 |
| 4,338,582 | 7/1982 | Presser | 333/175 |

FOREIGN PATENT DOCUMENTS 53-79359  7/1978  Japan .................................. 330/305

Primary Examiner—James B. Mullins
Attorney, Agent, or Firm—J. S. Tripoli; R. L. Troike; R. E. Smiley

[57] ABSTRACT

An amplifier including an in phase feedback signal to therefore exhibit negative resistance is receptive of an input alternating signal which includes a frequency F. The output of the amplifier is coupled to a resonator adjusted to a center frequency F and having undesirable resistance which is offset by the negative resistance of the amplifier. The resonator includes an inductor and adjustable capacitor arranged either in series or in parallel with the amplifier to therefore change the value of F.

19 Claims, 4 Drawing Figures

BANDPASS FILTER WITH AN ACTIVE ELEMENT

This invention relates to bandpass filters and more particularly, to bandpass filters employing an active element.

High Q tunable filters operational at microwave frequencies are vital components in various electronic counter-measure and electronic warfare systems. In many cases, these filters are desirably electronically tunable at high speeds over wide frequency ranges. In the prior art, Yittrium Iron Garnet (YIG) resonators, tunable over a wide band of frequencies, have been predominately used in microwave filter applications because of their inherent excellent selectivity and linearity characteristics over multi-octave frequency ranges. However, a filter comprised of a YIG resonator has severe restrictions with regard to slow tuning speed and suffers from other drawbacks such as large size relative to solid state components, hysteresis, temperature sensitivity and required bulky power supplies.

An alternative approach is the use of standard resonators which are capacitively loaded by a voltage tuned varactor diode. These diodes can provide octave bandwidth tuning ranges with reasonable linearity, offer very fast tuning speed (about 3 order of magnitude faster than YIGs) of the filter and permit the fabrication of filters small in size and weight compared to those using YIG resonators. At microwave frequencies, resonators utilizing varactors, which inherently have a large resistive component, however, undesirably exhibit relatively low Q. The large resistive component results in a greatly reduced achievable selectivity and also results in great loss of the signal in filter applications.

U.S. patent application Ser. No. 70,022 by A. Presser entitled "Electronically Tunable Resonator Circuit", filed Aug. 27, 1979, and assigned to the common assignee, now U.S. Pat. No. 4,338,582 issued July 6, 1982, describes an electronically frequency tunable resonator for use in a filter and which comprises an electronically adjustable capacitor, an inductor coupled in combination with the capacitor and arranged to resonate at any of a range of frequencies determined by the value of the capacitor. The combination also exhibits a resistance. An active element characterized by a negative resistance is arranged with the combination to offset the resistance of the combination.

In accordance with a preferred embodiment of the invention, a bandpass filter circuit comprises the combination of an output terminal, a circuit reference point, negative resistance means including first and second amplifying means connected in cascode between the reference point and output terminal with the first amplifying means coupled between the second amplifying means and the reference point. The negative resistance means is responsive at an input terminal thereof to the radio frequency signals which include the frequency F for amplifying the same. The negative resistance means also includes means for feeding back in phase a sufficient portion of the signal appearing at the output terminal to the junction of the first and second amplifying means for producing a negative resistance at the output terminal relative to the circuit reference point. An inductor and capacitor are coupled to the output terminal to form a resonance circuit having a center frequency of F. The capacitor and inductor have undesirable resistance which is offset by the negative resistance of the amplifying means.

Figure 1:
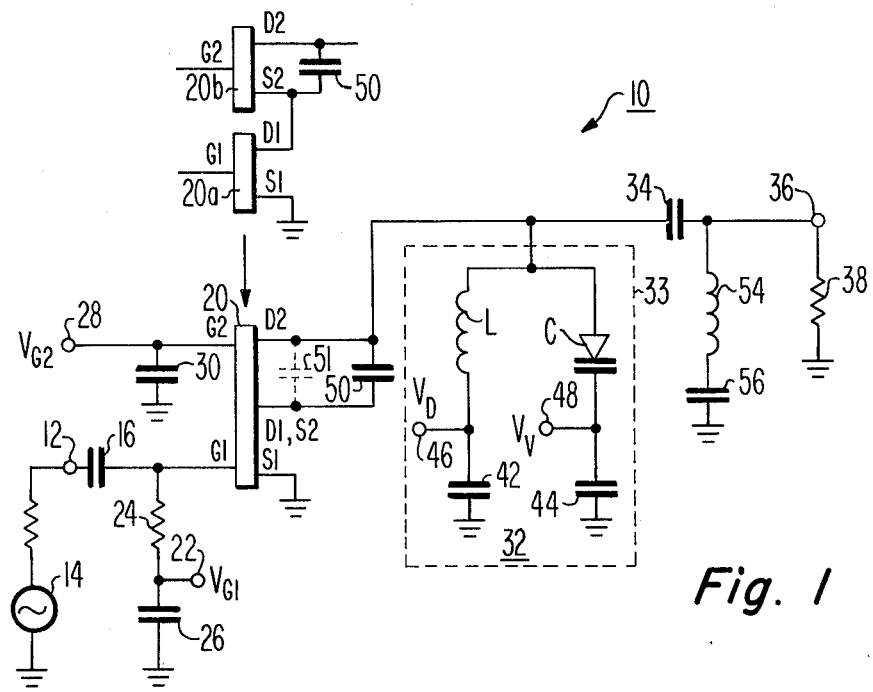
FIG. 1 is an electrical schematic representation of a bandpass filter employing a dual gate field effect transistor with an inductor and capacitor arranged as a parallel resonant circuit.

With reference to FIG. 1, a bandpass filter generally indicated at 10 has an input terminal 12 to which is resistively coupled a signal source 14. Terminal 12 is coupled to a DC blocking capacitor 16 which is coupled to the gate 1 (G1) connection of a dual gate field effect transistor (FET) 20. A terminal 22 is receptive of a gate bias voltage $V_{G1}$ and is coupled via a resistor 24 to G1 and via bypass capacitor 26 to a circuit reference point such as circuit ground. Second gate connection G2 of FET 20 is connected to a terminal 28 which is receptive of bias voltage $V_{G2}$ and is coupled via bypass capacitor 30 to circuit ground.

The source connection S1 of FET 20 is connected to circuit ground. FET 20 is arranged in a cascode arrangement. Drain connection D2 of FET 20 is coupled to a tunable resonator 32 located within a dashed box 33 and via coupling capacitor 34 to an output terminal 36. A load as represented by resistor 38, impedance matched to the output impedance of filter 10, is coupled between terminal 36 and circuit ground.

Resonator 32 consists of the parallel combination of a fixed value inductor L and an adjustable capacitor such as a varactor C. The inductor and capacitor are each coupled via respective bypass capacitors 42 and 44 to circuit ground. A terminal 46 connected to the junction of inductor L and capacitor 42 is receptive of drain bias voltage $V_D$. A terminal 48 connected to the junction of varactor C and capacitor 44 is receptive of varactor control voltage $V_V$, the value of which controls the capacitive value of capacitor C. By a proper choice of L, C and $V_V$ the resonator 32 can be caused to resonate at any desired center frequency F. An optional feedback capacitor 50 is connected between drain connection D2 and the junction of drain D1 of the portion of FET 20 associated with gate connection G1 and source connection S2 of the portion of FET 20 associated with gate connection G2. Capacitor 50 is in addition to interelectrode capacitance illustrated by a capacitor 51 normally present in an FET or other type transistor.

It is to be understood that most commercially purchased dual gate FET's do not have a terminal connected to D1 and S2, although such a transistor can be manufactured on special order. In the event that special transistor 20 is not available, two single gate FET transistors, such as 20a and 20b, illustrated above FET 20 in FIG. 1, and arranged in cascode, can be substituted for FET 20.

As a further option to filter 10, the series combination of an inductor 54 and capacitor 56, connected between terminal 36 and circuit ground, operates as a load equalizer to vary the loading on FET 20 as a function of the value of frequency F to compensate for changes of FET parameters versus frequency. The load equalizer may or may not be needed, depending on the frequency range over which filter 10 operates and the quality of FET 20.

Figure 2:
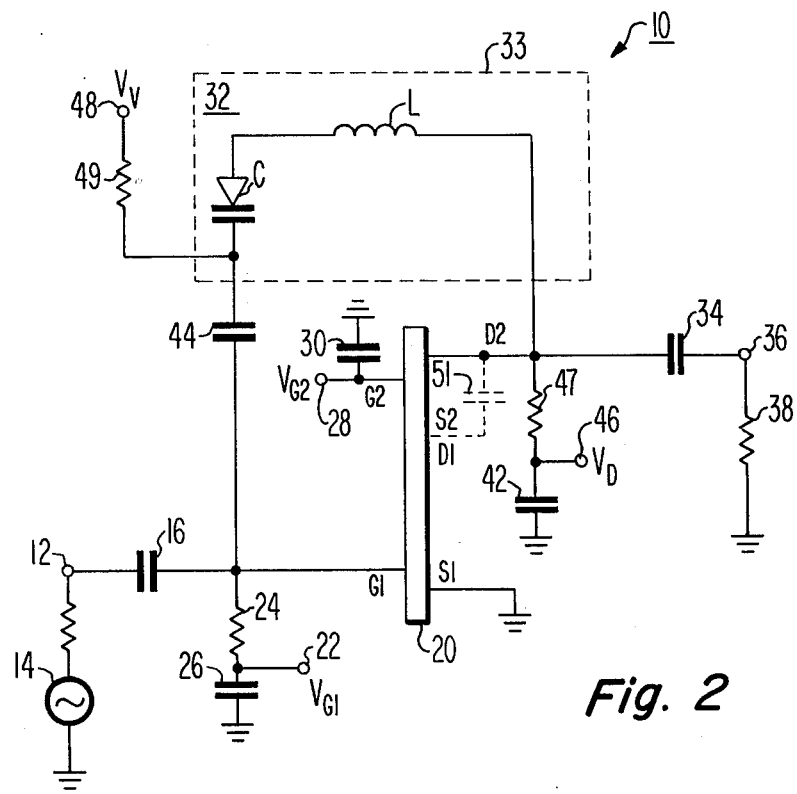
FIG. 2 is an electrical schematic representation of a bandpass filter employing a dual gate field effect transistor with an inductor and capacitor arranged in a series resonance circuit.

FIG. 2 is similar to FIG. 1 except that optional components 50, 54 and 56 are not illustrated and more importantly, the resonator 32 is a series resonator rather than the parallel resonator of FIG. 1. In FIG. 2, resonator elements L and C are connected in series between drain connection D2 and gate connection G1. Terminal 46 is connected via decoupling resistor 47 to D2 while terminal 48 is connected via decoupling resistor 49 to varactor C. In FIG. 2, because only interelectrode capacitor 51 is connected between drain connection D2 and the juncture of S2 and D1, no special FET 20 is required. The series connected resonator of FIG. 2 could be used with a real feedback capacitor 50, such as illustrated in FIG. 1, while the parallel resonator circuit of FIG. 1 could be used with only interelectrode capacitance normally present in an FET.

Figure 3:
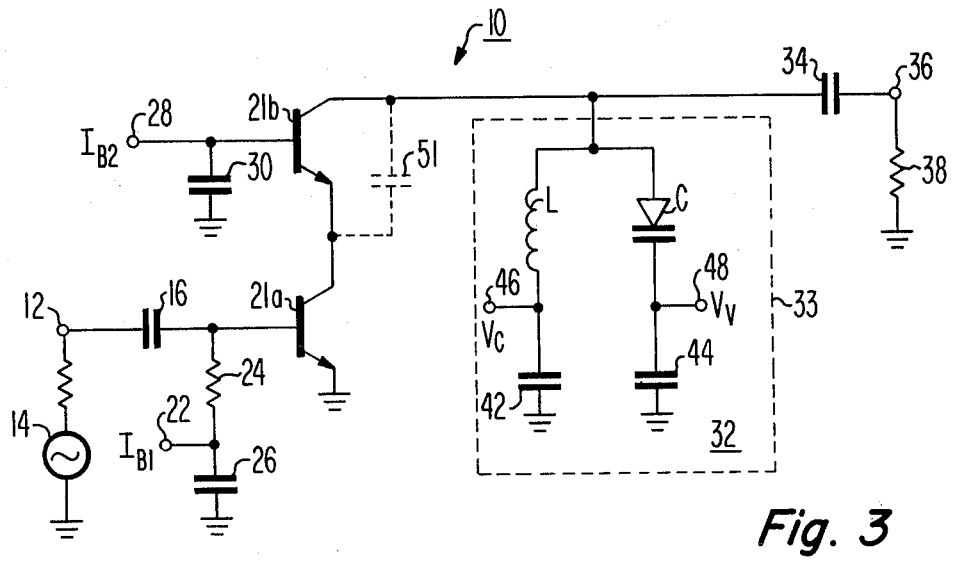
FIG. 3 is a bandpass filter with a pair of bipolar transistors and with an inductor and capacitor arranged in a parallel resonance circuit.

FIG. 3 illustrates a filter similar to that of FIG. 1, except that, again, optional elements 50, 54 and 56 are absent and NPN bipolar transistors 21a and 21b are substituted for FET 20. A further difference is that base biases for transistors 21a and 21b are supplied by current sources $I_{B1}$ and $I_{B2}$ replacing voltage sources $V_{G1}$ and $V_{G2}$ and collector voltage $V_C$ applied at terminal 46 replaces drain voltage $V_D$. Interelectrode capacitor 51 is illustrated in phantom as extending between the collector and emitter of transistor 21b.

Figure 4:
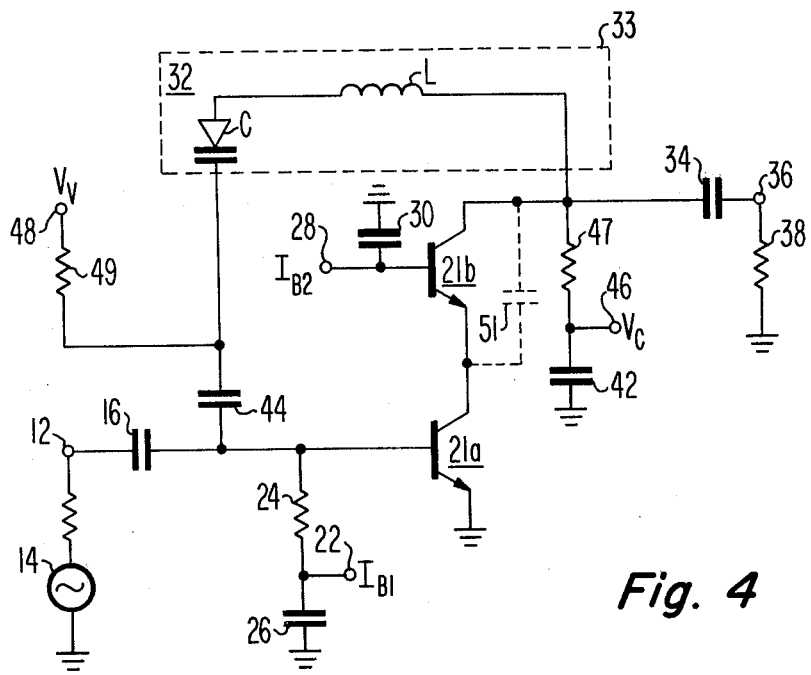
FIG. 4 is an electrical schematic representation of a bandpass filter with a pair of bipolar transistors and with an inductor and capacitor arranged in a series resonance circuit.

FIG. 4 illustrates a filter similar to that of FIG. 3 except that a series resonator circuit similar to that of FIG. 2 is employed.

Operation of the circuit of FIG. 1 will now be described. (Operation of the other circuits is similar.) An input alternating signal from source 14, which may be the output of a previous filter 10, and which includes frequency F is applied between input terminal 12 and circuit ground through blocking capacitor 16 to gate connection G1 of FET 20. By way of example, F may be 10 GHz. The signal is amplified by the first section of FET 20 equivalent to transistor 20a of the two FET alternative arrangement. The first section of transistor 20 operates in the common source mode. (Transistor 21a in FIGS. 3 and 4 operates in the common emitter mode.) The amplified output signal from the first transistor section at D1 is applied between S2 and G2 of the second transistor section since capacitor 30 acts as a short circuit at the frequencies of interest and, therefore, the second section of transistor 20 operates in a common gate mode. Thus, as is well known to those skilled in the art, the voltage at connection D2 is substantially in phase with the voltage at S2. Since capacitor 50 (and/or interelectrode capacitor 51) feeds back to S2 a fraction of the signal appearing at D2 in phase, a negative conductance or resistance develops at the connection D2 of FET 20. The amount of negative resistance is determined by the value of DC bias signal applied at terminal 28. The amplified signal from source 14 appearing between D2 and circuit ground is applied to resonator 32 which is tuned to resonate at a particular chosen center frequency F determined by the choice of inductor L and varactor C and by the voltage $V_V$ applied at terminal 48 to precisely control the value of capacitance of C.

As mentioned in detail in the aforementioned U.S. patent application Ser. No. 70,022 filed Aug. 27, 1979, resonator 32 has undesirable resistance in the various components and interconnections thereof which undesirably reduces the selectivity or Q of the resonator. The negative resistance produced by FET 20 offsets this undesirable resistance to thus provide a high Q filter. The output signal at frequency F is coupled through coupling capacitor 34 to load 38 at terminal 36. Load 38 may be another filter 10. As $V_V$ is changed the resonance frequency F of resonator 32 is changed and thus the frequency F of filter 10 is changed. If load equalizer components 54 and 56 are present they compensate for changes of FET 20 parameters with change in frequency.

The frequency response of filter 10 from input terminal 12 to output terminal 36 is:

$$\frac{F}{\Delta F} = \frac{B}{G_F + G_R + G_L} = \frac{B}{G_T} \qquad (1)$$

Where F is the center frequency of the filter, $\Delta F$ is the 3-db bandwidth, B is the susceptance of either the inductor or varactor, $G_F$ is the output conductance of FET 20, $G_R$ is the conductance associated with the losses in resonator 32, and $G_L$ is the load conductance presented by the load equalization components 54 and 56 if utilized. Equation (1) describes the single-pole response of highly selective resonator 32 and assumes negligible gain effects from the low-selectivity associated circuitry. Since $G_F$ is negative due to a combination of internal and external (if any) feedback on FET 20, total conductance $G_T$ can be made very low and therefore $F/\Delta F$ can be made very high. As previously mentioned, the negative conductance of FET 20 can be adjusted by means of adjusting the voltage applied to terminal 28 in FIGS. 1 and 2 or current applied to terminal 28 in FIGS. 3 and 4.

The value of negative conductance of FET 20 is a function of frequency at which the resonator is set. Therefore, in a practical circuit it may be desirable to change the frequency of filter 10 by changing both the values $V_V$ and $V_{G2}$ or $I_{B2}$.

The circuits of FIGS. 1 and 2 can be easily fabricated in monolithic form. High tuning speed can be achieved since the varactor C draws very little current and thus can be tuned rapidly.

In one experiment circuit with a 3-db bandwidth of approximately 40 MHz and with capacitor C varied between 1.4 and 0.2 pF a filter varying between 7.0 to 11.0 GHz can be achieved with a filter insertion gain of approximately 32-db. This circuit utilizes an inductance L of 0.25 nanohenries and a dual gate FET manufactured by Nippon Electric Company (NEC), type 46,000.

What is claimed is:

1. A bandpass filter for passing radio frequency signals, including frequency F, over a given range of frequencies comprising in combination:

a circuit reference point;
an output terminal;
a negative resistance means including first and second amplifying means connected in cascode between said reference point and said output terminal with said first amplifying means coupled between said second amplifying means and said reference point and responsive at an input terminal thereof to said radio frequency signals which include said frequency F for amplifying the same, means for feeding back in phase a sufficient portion of the signal appearing at said output terminal to the junction of said first and second amplifying means for producing a negative resistance at said output terminal relative to said circuit reference point; and an inductor and a capacitor coupled to said output terminal to form a resonant circuit having a center frequency of said F and having undesired resistance which is offset by said negative resistance.

2. The combination as set forth in claim 1 wherein said inductor and capacitor are coupled in parallel between said output terminal and circuit reference point.

3. The combination as set forth in claim 1 wherein said inductor and capacitor are coupled in series between said output terminal and input terminal.

4. The combination as set forth in claim 2 wherein said capacitor includes means for varying its value to thereby vary the value of said center frequency F.

5. The combination as set forth in claim 3 wherein said capacitor includes means for varying its value to thereby vary the value of said center frequency F.

6. The combination as set forth in claim 2 wherein said first and second amplifying means comprise a dual gate field effect transistor having drain and source terminals connected to said output terminal and circuit reference point, respectively, having one gate coupled to receive said radio frequency signals and having an internal drain-source function to which said feedback means is connected.

7. The combination as set forth in claim 3 wherein said first and second amplifying means comprise a dual gate field effect transistor having drain and source terminals connected to said output terminal and circuit reference point, respectively, having one gate coupled to receive said radio frequency signals and having an internal drain-source function to which said feedback means is connected.

8. The combination as set forth in claim 2 wherein said first and second amplifying means comprise first and second bipolar transistors of the same conductivity type, the emitter of the first transistor being coupled to said reference circuit point, the collector of said first transistor and emitter of said second transistor being connected together, the collector of said second transistor being coupled to said output terminal, the base of said first transistor being coupled to receive said input signal.

9. The combination as set forth in claim 3 wherein said first and second amplifying means comprise first and second bipolar transistors of the same conductivity type, the emitter of the first transistor being coupled to said reference circuit point, the collector of said first transistor and emitter of said second transistor being connected together, the collector of said second transistor being coupled to said output terminal, the base of said first transistor being coupled to receive said input signal.

10. The combination as set forth in claim 8 wherein said feedback means is coupled between said second transistor collector and emitter.

11. The combination as set forth in claim 9 wherein said feedback means is coupled between said second transistor collector and emitter.

12. The combination as set forth in claim 10 wherein said second transistor base is adapted to receive a signal for controlling the amount of negative resistance exhibited by said amplifying means.

13. The combination as set forth in claim 11 wherein said second transistor base is adapted to receive a signal for controlling the amount of negative resistance exhibited by said amplifying means.

14. The combination as set forth in claim 6 wherein said dual gate field effect transistor is comprised of two portions, each having a source, drain and gate connection, said source connection of said first transistor being coupled to said source terminal, said drain connection of said second transistor being coupled to said drain terminal, the source connection of said second transistor being coupled to the drain connection of said first transistor and wherein said first transistor gate connection is coupled to receive said radio frequency signals and wherein said feedback means extends between said second transistor source and drain connections.

15. The combination as set forth in claim 7 wherein said dual gate field effect transistor is comprised of two portions, each having a source, drain and gate connection, said source connection of said first transistor being coupled to said source terminal, said drain connection of said second transistor being coupled to said drain terminal, the source connection of said second transistor being coupled to the drain connection of said first transistor and wherein said first transistor gate connection is coupled to receive said radio frequency signals and wherein said feedback means extends between said second transistor source and drain connections.

16. The combination as set forth in claim 14 wherein said second transistor gate connection is coupled to receive a bias voltage, the value of which controls the amount of negative resistance of said amplifying means.

17. The combination as set forth in claim 15 wherein said second transistor gate connection is coupled to receive a bias voltage, the value of which controls the amount of negative resistance of said amplifying means.

18. The combination as set forth in claim 16 wherein said second transistor gate connection is alternating current connected to said circuit reference point.

19. The combination as set forth in claim 17 wherein said second transistor gate connection is alternating current connected to said circuit reference point.

* * * * *